United States Patent
Sugiyama et al.

(10) Patent No.: US 10,196,467 B2
(45) Date of Patent: Feb. 5, 2019

(54) FLUORINATED POLYMER, METHOD FOR ITS PRODUCTION, AND CURED PRODUCT OF THE FLUORINATED POLYMER

(71) Applicant: AGC Inc., Chiyoda-ku (JP)

(72) Inventors: Norihide Sugiyama, Chiyoda-ku (JP); Masahiro Ohkura, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 0 days.

(21) Appl. No.: 15/890,873

(22) Filed: Feb. 7, 2018

(65) Prior Publication Data

US 2018/0162974 A1 Jun. 14, 2018

Related U.S. Application Data

(63) Continuation of application No. PCT/JP2016/075078, filed on Aug. 26, 2016.

(30) Foreign Application Priority Data

Sep. 1, 2015 (JP) ................. 2015-171756

(51) Int. Cl.
| | |
|---|---|
| *C08F 216/14* | (2006.01) |
| *C08F 214/28* | (2006.01) |
| *C08F 14/18* | (2006.01) |
| *H01L 33/56* | (2010.01) |
| *C08F 8/30* | (2006.01) |
| *C08J 3/28* | (2006.01) |
| *C08F 16/28* | (2006.01) |

(52) U.S. Cl.
CPC .......... *C08F 216/1458* (2013.01); *C08F 8/30* (2013.01); *C08F 14/18* (2013.01); *C08F 16/28* (2013.01); *C08F 214/287* (2013.01); *C08J 3/28* (2013.01); *H01L 33/56* (2013.01); *C08F 2800/10* (2013.01); *C08J 2327/22* (2013.01); *C08J 2329/10* (2013.01)

(58) Field of Classification Search
None
See application file for complete search history.

(56) References Cited

U.S. PATENT DOCUMENTS

| | | | | |
|---|---|---|---|---|
| 7,670,640 | B2* | 3/2010 | Araki ............... | C08F 14/18 427/162 |
| 2006/0135700 | A1* | 6/2006 | Grootaert ............ | C08F 214/18 525/326.2 |
| 2007/0146887 | A1 | 6/2007 | Ikeda et al. | |
| 2010/0144993 | A1* | 6/2010 | Araki ............... | C08F 14/18 526/245 |
| 2010/0324222 | A1 | 12/2010 | Hung et al. | |
| 2016/0280865 | A1 | 9/2016 | Sugiyama et al. | |

FOREIGN PATENT DOCUMENTS

| | | |
|---|---|---|
| JP | 2002-179871 | 6/2002 |
| JP | 2004-168896 | 6/2004 |
| JP | 2005-162994 | 6/2005 |
| JP | 2005-257786 | 9/2005 |
| JP | 2007-238737 | 9/2007 |
| JP | 2012-530800 | 12/2012 |
| WO | WO 2015/098773 A1 | 7/2015 |

OTHER PUBLICATIONS

International Search Report dated Nov. 15, 2016 in PCT/JP2016/075078, filed on Aug. 26, 2016.

* cited by examiner

*Primary Examiner* — Joseph Schoenholtz
(74) *Attorney, Agent, or Firm* — Oblon, McClelland, Maier & Neustadt, L.L.P.

(57) ABSTRACT

To provide a curable fluorinated polymer excellent in solubility in an alcohol, a method for its production and a cured product of the fluorinated polymer. A fluorinated polymer comprising units represented by the following formula (1), wherein in at least some of the units represented by the formula (1), $Z^1$ is $NR^1NR^2H$ or $NR^3OR^4$:

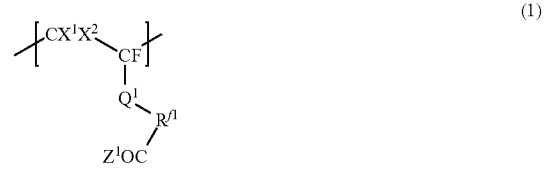

(1)

in the formula (1), $X^1$ and $X^2$ are each independently a hydrogen atom or a fluorine atom, $Q^1$ is a single bond or an etheric oxygen atom, $R^{f1}$ is a fluoroalkylene group, or a fluoroalkylene group with at least 2 carbon atoms, having an etheric oxygen atom between carbon-carbon atoms, $Z^1$ is $NR^1NR^2H$, $NR^3OR^4$ or $OR^5$, $R^1$, $R^2$, $R^3$ and $R^4$ are each independently a hydrogen atom or an alkyl group, and $R^5$ is an alkyl group.

10 Claims, No Drawings

FLUORINATED POLYMER, METHOD FOR ITS PRODUCTION, AND CURED PRODUCT OF THE FLUORINATED POLYMER

TECHNICAL FIELD

The present invention relates to a fluorinated polymer, a method for its production, and a cured product of the fluorinated polymer.

BACKGROUND ART

In recent years, white LED (Light Emitting Diode) has been put into practical use as a high-efficiency illumination light source, in place of incandescent and fluorescent lamps. White LED is adjusted to daylight white or warm white by combining a blue LED element and a yellow phosphor, and as the case requires with e.g. a red phosphor. In order to protect the LED element and the phosphor from the physical and chemical actions from the outside, the light emitting element is sealed with a transparent resin such as a silicone resin.

As such a transparent resin for sealing LED, a cured product has been proposed which is obtained by curing a curable fluorinated polymer having carboxylic acid alkyl ester groups such as $COOCH_3$ groups, by irradiation with active energy rays, and which is excellent in stability with less generation of HF (Patent Document 1).

PRIOR ART DOCUMENT

Patent Document

Patent Document 1: WO2015/098773

DISCLOSURE OF INVENTION

Technical Problem

However, according to a study made by the present inventors, since the fluorinated polymer disclosed in Patent Document 1 is inadequate in the hydrogen bonding property of the carboxylic acid alkyl ester groups in the fluorinated polymer, the solubility in an alcohol such as methanol is insufficient.

It is an object of the present invention to provide a fluorinated polymer which is excellent in solubility in an alcohol and which is curable.

Solution to Problem

The present invention provides a fluorinated polymer, a method for its production, a method for producing a cured product of the fluorinated polymer and a light emitting device, having the following constructions [1] to [10].

[1] A fluorinated polymer comprising units represented by the following formula (1), wherein in at least some of the units represented by the formula (1), $Z^1$ is $NR^1NR^2H$ or $NR^3OR^4$:

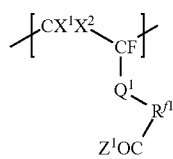
(1)

in the formula (1), $X^1$ and $X^2$ are each independently a hydrogen atom or a fluorine atom, $Q^1$ is a single bond or an etheric oxygen atom, $R^{f1}$ is a fluoroalkylene group, or a fluoroalkylene group with at least 2 carbon atoms, having an etheric oxygen atom between carbon-carbon atoms, $Z^1$ is $NR^1NR^2H$, $NR^3OR^4$ or $OR^5$, $R^1$, $R^2$, $R^3$ and $R^4$ are each independently a hydrogen atom or an alkyl group, and $R^5$ is an alkyl group.

[2] The fluorinated polymer according to [1], wherein at least some of the units represented by the formula (1) are —[$CF_2$—$CF(O(CF_2)_3CONHNH_2)$]— or —[$CF_2$—$CF(O(CF_2)_3CONHOH)$]—.

[3] The fluorinated polymer according to [1] or [2], which comprises units wherein $Z^1$ is $NR^1NR^2H$ and units wherein $Z^1$ is $OR^5$.

[4] The fluorinated polymer according to [1] or [2], which comprises units wherein $Z^1$ is $NR^3OR^4$.

[5] The fluorinated polymer according to any one of [1] to [4], which further contains units derived from fluoroethylene.

[6] The fluorinated polymer according to any one of [1] to [5], which further contains units represented by the following formula (3) (but excluding units derived from fluoroethylene):

$$—[CX^3X^4—CY^1Y^2]— \quad (3)$$

in the formula (3), $X^3$ and $X^4$ are each independently a hydrogen atom, a fluorine atom or a chlorine atom, $Y^1$ is a hydrogen atom, a fluorine atom or a chlorine atom, and $Y^2$ is a hydrogen atom, a fluoroalkyl group, a fluoroalkyl group with at least 2 carbon atoms, having an etheric oxygen atom between carbon-carbon atoms, a fluoroalkoxy group, a fluoroalkoxy group with at least 2 carbon atoms, having an etheric oxygen atom between carbon-carbon atoms, a fluoroalkenyl group, or a fluoroalkenyl group with at least 2 carbon atoms, having an etheric oxygen atom between carbon-carbon atoms.

[7] The fluorinated polymer according to any one of [1] to [6], wherein the proportion of the group represented by —$COZ^1$ is from 0.1 to 4 mmol/g.

[8] A method for producing the fluorinated polymer as defined in any one of [1] to [7], characterized by reacting a fluorinated polymer comprising units represented by the following formula (1a), with at least one compound selected from the group consisting of a hydrazine compound of the following formula (5) and a hydroxylamine compound represented by the following formula (6):

in the formula (1a), $X^2$, $Q^1$, $R^{f1}$ and $R^5$ are as defined in [1], in the formula (5), $R^1$ and $R^2$ are as defined in [1], and in the formula (6), $R^3$ and $R^4$ are as defined in [1].

[9] A method for producing a cured product of a fluorinated polymer, characterized by subjecting the fluorinated polymer as defined in any one of [1] to [7] to at least one of heating and active energy ray irradiation. [10] A light emitting device characterized by comprising a light emitting element and a cured product of the fluorinated polymer as defined in any one of [1] to [7].

Advantageous Effects of Invention

According to the present invention, it is possible to provide a fluorinated polymer which is excellent in solubility in an alcohol and which is curable.

DESCRIPTION OF EMBODIMENTS

Hereinafter, embodiments of the present invention will be described. However, the present invention should not be construed as being limited to the following description.
[Definitions of Terms in this Specification]

A compound represented by formula (a) may be referred to as a compound (a). Compounds represented by other formulae may also be referred to in the same manner. A unit represented by the formula (b) may be referred to as a unit (b). Units represented by other formulae may also be referred to in the same manner.

The term "transparent sealing" is meant for sealing having both functions of transmitting light and sealing function.

A "unit" in the polymer is meant for a moiety derived from a monomer, formed by polymerization of the monomer.

"Fluoroethylene" is meant for a compound having from 0 to 3 fluorine atoms in tetrafluoroethylene ($CF_2=CF_2$) substituted by hydrogen atom(s) or halogen atom(s) (such as chlorine, bromine or iodine) other than fluorine atom(s).

A group having a carbon atom chain such as an alkyl group, a fluoroalkyl group, a fluoroalkylene group, a fluoroalkoxy group or a fluoroalkenyl group, may be linear or branched.

A "fluoroalkyl group" refers to a group having at least one hydrogen atom in an alkyl group substituted by a fluorine atom. The proportion of fluorine atoms in a fluoroalkyl group is, when represented by (the number of fluorine atoms in the fluoroalkyl group)/(the number of hydrogen atoms in an alkyl group with the same number of carbon atoms as in the fluoroalkyl group)×100(%), preferably at least 50%, particularly preferably 100% i.e. a perfluoroalkyl group. The same applies to a fluoroalkylene group, a fluoroalkoxy group, or a fluoroalkenyl group, and preferred is a perfluoroalkylene group, a perfluoroalkoxy group or a perfluoroalkenyl group.

Unless otherwise specified, "curing" means curing by cross-linking.
[Fluorinated Polymer]

The fluorinated polymer of the present invention comprises units represented by the following formula (1) (hereinafter referred to also as "units (1)"), wherein in at least some of the units (1), $Z^1$ is $NR^1NR^2H$ or $NR^3OR^4$:

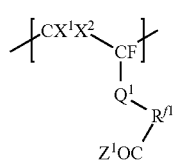

(1)

in the formula (1), $X^1$ and $X^2$ are each independently a hydrogen atom or a fluorine atom, $Q^1$ is a single bond or an etheric oxygen atom, $R^{f1}$ is a fluoroalkylene group, or a fluoroalkylene group with at least 2 carbon atoms, having an etheric oxygen atom between carbon-carbon atoms, $Z^1$ is $NR^1NR^2H$, $NR^3OR^4$ or $OR^5$, $R^1$, $R^2$, $R^3$ and $R^4$ are each independently a hydrogen atom or an alkyl group, and $R^5$ is an alkyl group.

In the fluorinated polymer of the present invention, in at least some of the units (1), $Z^1$ is $NR^1NR^2H$ or $NR^3OR^4$, whereby even if the fluorinated polymer is a perfluoropolymer, or a fluorinated polymer having a high fluorine atom content, it is soluble in an alcohol.

The alcohol may, for example, be methanol, ethanol, n-propanol, isopropanol, n-butanol, isobutanol, tert-butanol, methoxyethanol, methoxypropanol, etc., and methanol or ethanol is preferred. The fluorinated polymer is soluble at room temperature (25° C.) in an amount of preferably at least 2 mass %, more preferably at least 3 mass %, further preferably at least 4 mass %, particularly preferably at least 5 mass %, based on the total of the alcohol (preferably methanol) and the fluorinated polymer. Here, the fluorinated polymer may, so long as it has a property of being soluble in an alcohol, be dissolved in an ether solvent and a fluorinated solvent which will be described later.
(Units Represented by the Formula (1) (Units (1))

In the units (1), $Q^1$ is preferably an etheric oxygen atom.

In the units (1), in a case where $R^{f1}$ is a fluoroalkylene group, the number of carbon atoms is preferably from 1 to 6, particularly preferably from 1 to 4. In a case where the number of carbon atoms is at least 3, a straight chain structure is preferred from the viewpoint of excellent thermal stability. The fluoroalkylene group is preferably a perfluoroalkylene group from the viewpoint of excellent thermal stability. That is, $R^{f1}$ is preferably a perfluoroalkylene group having from 1 to 6 carbon atoms, particularly preferably a perfluoroalkylene group having from 1 to 4 carbon atoms.

In the units (1), in a case where $R^{f1}$ is a fluoroalkylene group with at least 2 carbon atoms, having an etheric oxygen atom between carbon-carbon atoms, the number of carbon atoms is preferably from 2 to 10, particularly preferably from 2 to 6. In a case where the number of carbon atoms is at least 3, a straight chain structure is preferred from the viewpoint of excellent thermal stability. The fluoroalkylene group is preferably a perfluoroalkylene group from the viewpoint of excellent thermal stability. That is, $R^{f1}$ is preferably a perfluoroalkylene group with from 2 to 10 carbon atoms, having an etheric oxygen atom between carbon-carbon atoms, particularly preferably a perfluoroalkylene group with from 2 to 6 carbon atoms, having an etheric oxygen atom between carbon-carbon atoms.

$R^1$, $R^2$, $R^3$ and $R^4$ are, from such a viewpoint that hydrogen bonding is high, and solubility of the fluorinated polymer in the alcohol is excellent, each preferably a hydrogen atom or an alkyl group having from 1 to 6 carbon atoms, more preferably a hydrogen atom or an alkyl group having 1 or 2 carbon atoms, particularly preferably a hydrogen atom.

As specific examples of the units (1), the following units may be mentioned.
—[$CF_2$—$CF(O(CF_2)_2CONHNH_2)$]—
—[$CF_2$—$CF(O(CF_2)_2CON(CH_3)NHCH_3)$]—
—[$CF_2$—$CF(O(CF_2)_2CONHOH)$]—
—[$CF_2$—$CF(O(CF_2)_2CONHOCH_3)$]—
—[$CF_2$—$CF(O(CF_2)_3CONHNH_2)$]—
—[$CF_2$—$CF(O(CF_2)_3CON(CH_3)NHCH_3)$]—
—[$CF_2$—$CF(O(CF_2)_3CONHOH)$]—
—[$CF_2$—$CF(O(CF_2)_3CONHOCH_3)$]—
—[$CF_2$—$CF(O(CF_2)_4CONHNH_2)$]—

—[$CF_2$—$CF(O(CF_2)_4CON(CH_3)NHCH_3)$]—
—[$CF_2$—$CF(O(CF_2)_4CONHOH)$]—
—[$CF_2$—$CF(O(CF_2)_4CONHOCH_3)$]—
—[$CF_2$—$CF(OCF_2CF(CF_3)O(CF_2)_2CONHNH_2)$]—
—[$CF_2$—$CF(OCF_2CF(CF_3)O(CF_2)_2CON(CH_3)NHCH_3)$]—
—[$CF_2$—$CF(OCF_2CF(CF_3)O(CF_2)_2CON HOH)$]—
—[$CF_2$—$CF(OCF_2CF(CF_3)O(CF_2)_2CONHOCH_3)$]—
—[$CF_2$—$CF(OCF_2CF(CF_3)O(CF_2)_3CONHNH_2)$]—
—[$CF_2$—$CF(OCF_2CF(CF_3)O(CF_2CON(CH_3)NHCH_3)$]—
—[$CF_2$—$CF(OCF_2CF(CF_3)O(CF_2)_3CONHOH)$]—
—[$CF_2$—$CF(OCF_2CF(CF_3)O(CF_2)_3CONHOCH_3)$]—
—[$CF_2$—$CF(O(CF_2)_3O(CF_2)_2CONHNH_2)$]—
—[$CF_2$—$CF(O(CF_2)_3O(CF_2)_2CON(CH_3)NHCH_3)$]—
—[$CF_2$—$CF(O(CF_2)_3O(CF_2)_2CONHOH)$]—
—[$CF_2$—$CF(O(CF_2)_3O(CF_2)_2CONHOCH_3)$]—
—[$CF_2$—$CF(O(CF_2)_2O(CF_2)_2CONHNH_2)$]—
—[$CF_2$—$CF(O(CF_2)_2O(CF_2)_2CON(CH_3)NHCH_3)$]—
—[$CF_2$—$CF(O(CF_2)_2O(CF_2)_2CONHOH)$]—
—[$CF_2$—$CF(O(CF_2)_2O(CF_2CONHOCH_3)$]—
—[$CH_2$—$CF(CF_2OCF(CF_3)CONHNH_2)$]—
—[$CH_2$—$CF(CF_2OCF(CF_3)CON(CH_3)NHCH_3)$]—
—[$CH_2$—$CF(CF_2OCF(CF_3)CONHOH)$]—
—[$CH_2$—$CF(CF_2OCF(CF_3)CONHOCH_3)$]—
—[$CH_2$—$CF(CF_2OCF(CF_3)CF_2OCF(CF_3)CONHNH_2)$]—
—[$CH_2$—$CF(CF_2OCF(CF_3)CF_2OCF(CF_3)CON(CH_3)NHCH_3)$]—
—[$CH_2$—$CF(CF_2OCF(CF_3)CF_2OCF(CF_3)CONHOH)$]—
—[$CH_2$—$CF(CF_2OCF(CF_3)CF_2OCF(CF_3)CONHOCH_3)$]—

From the viewpoint of availability, the units (1) are particularly preferably —[$CF_2$—$CF(O(CF_2)_3CONHNH_2)$]— or —[$CF_2$—$CF(O(CF_2)_3CONHOH)$]—.

The fluorinated polymer may comprise one type of the units (1) alone, or may comprise two or more types of the units (1) in combination. From such a viewpoint that hydrogen bonding is higher and adhesion to a substrate such as glass will be further excellent, the fluorinated polymer is preferably a polymer comprising the units wherein $Z^1$ is $NR^1NR^2H$. From such a viewpoint that photocrosslinking becomes possible, the fluorinated polymer is preferably a polymer comprising the units wherein $Z^1$ is $NR^1NR^2H$ and the units wherein $Z^1$ is $OR^5$, or a polymer comprising the units wherein $Z^1$ is $NR^3OR^4$. However, not limited thereto, the fluorinated polymer may be a polymer comprising the units wherein $Z^1$ is $NR^1NR^2H$, the units wherein $Z^1$ is $NR^3OR^4$ and the units wherein $Z^1$ is $OR^5$, or may be a polymer comprising the units wherein $Z^1$ is $NR^3OR^4$ and the units wherein $Z^1$ is $NR^3OR^4$.

The units (1) wherein $Z^1$ is $OR^5$ can be formed by polymerizing a compound represented by the following formula (11) as a monomer. Further, the units (1) wherein $Z^1$ is $NR^1NR^2H$ and $NR^3OR^4$ can be formed by the method for producing a fluorinated polymer to be described later.

$$CX^1X^2=CF-Q^1-R^{f1}—COOR^5 \quad (11)$$

In the formula (11), $X^1$, $X^2$, $Q^1$, $R^{f1}$ and $OR^5$ are as defined in the formula (1), and their examples and preferred ranges are also the same.

(Further Units)

The fluorinated polymer of the present invention may further have units derived from fluoroethylene (hereinafter referred to also as "units (2)"), units represented by the formula (3) as described below (hereinafter referred to also as "units (3)"), and other units (hereinafter referred to also as "units (4)").

<Units Derived from Fluoroethylene (Units (2))>

Specific examples of the units (2) may be units derived from e.g. tetrafluoroethylene ($CF_2$=$CF_2$) (TFE), trifluoroethylene ($CF_2$=CHF) (TrFE), chlorotrifluoroethylene (CFCl=$CF_2$), or vinylidene fluoride ($CF_2$=$CH_2$). From the viewpoint of excellent light resistance, units derived from TFE, TrFE or chlorotrifluoroethylene, are preferred. From such a viewpoint that highly polar —$COZ^1$ groups tend to be present at the interface so that adhesion to the substrate will be excellent, units derived from TFE are particularly preferred. From such a viewpoint that crystallinity of the fluorinated polymer will not be so high as compared with TFE, light scattering will be less likely to occur, and transparency will be high, units derived from TrFE or chlorotrifluoroethylene, are particularly preferred. From the viewpoint of excellent solubility in an alcohol, units derived from TrFE are particularly preferred.

The fluorinated polymer may contain one type of the units (2) alone, or two or more types of the units (2) in combination.

<Units Represented by the Formula (3) (Units (3))>

The units (3) are units represented by the following formula (3) (but excluding the units derived from fluoroethylene.).

$$—[CX^3X^4—CY^1Y^2]— \quad (3)$$

In the formula (3), $X^3$ and $X^4$ are each independently a hydrogen atom, a fluorine atom or a chlorine atom, $Y^1$ is a hydrogen atom, a fluorine atom or a chlorine atom, and $Y^2$ is a hydrogen atom, a fluoroalkyl group, a fluoroalkyl group with at least 2 carbon atoms, having an etheric oxygen atom between carbon-carbon atoms, a fluoroalkoxy group, a fluoroalkoxy group with at least 2 carbon atoms, having an etheric oxygen atom between carbon-carbon atoms, a fluoroalkenyl group, or a fluoroalkenyl group with at least 2 carbon atoms, having an etheric oxygen atom between carbon-carbon atoms.

In $Y^2$, the fluoroalkyl group has preferably from 1 to 15 carbon atoms, particularly preferably from 1 to 6 carbon atoms. From the viewpoint of excellent thermal stability, it is preferably a perfluoroalkyl group, more preferably a perfluoroalkyl group having from 1 to 6 carbon atoms, particularly preferably —$CF_3$. In $Y^2$, the fluoroalkyl group with at least 2 carbon atoms, having an etheric oxygen atom between carbon-carbon atoms, has preferably from 2 to 15 carbon atoms, particularly from 2 to 6 carbon atoms. From the viewpoint of excellent thermal stability, the fluoroalkyl group with at least 2 carbon atoms, having an etheric oxygen atom between carbon-carbon atoms, is preferably a perfluoroalkyl group with at least 2 carbon atoms, having an etheric oxygen atom between carbon-carbon atoms, particularly preferably a perfluoroalkyl group with from 2 to 6 carbon atoms, having an etheric oxygen atom between carbon-carbon atoms.

In $Y^2$, the fluoroalkoxy group has preferably from 1 to 15 carbon atoms, particularly preferably from 1 to 6 carbon atoms. From the viewpoint of excellent thermal stability, the fluoroalkoxy group is preferably a perfluoroalkoxy group with from 1 to 6 carbon atoms, particularly preferably —$OCF_3$, —$OCF_2CF_3$, —$O(CF_2)_2CF_3$ or —$O(CF_2)_3CF_3$. In $Y^2$, the fluoroalkoxy group with at least 2 carbon atoms, having an etheric oxygen atom between carbon-carbon atoms, has preferably from 2 to 15 carbon atoms, particularly preferably from 2 to 6 carbon atoms. From the viewpoint of excellent thermal stability, the fluoroalkoxy group with at least 2 carbon atoms, having an etheric oxygen atom between carbon-carbon atoms, is preferably a perfluoroalkoxy group with at least 2 carbon atoms, having an etheric oxygen atom between carbon-carbon atoms, particularly preferably a perfluoroalkoxy group with from 2 to 6 carbon atoms, having an etheric oxygen atom between carbon-carbon atoms.

In $Y^2$, the fluoroalkenyl group has preferably from 5 to 15 carbon atoms, from such a viewpoint that a cyclization reaction does not proceed in the molecule, and the synthesis is easy. From the viewpoint of excellent thermal stability, the fluoroalkenyl group is preferably a perfluoroalkenyl group, particularly preferably $-(CF_2)_4CF=CF_2$, $-(CF_2)_5CF=CF_2$ or $-(CF_2)_6CF=CF_2$. In $Y^2$, the fluoroalkenyl group with at least 2 carbon atoms, having an etheric oxygen atom between carbon-carbon atoms, has preferably from 2 to 15 carbon atoms, particularly preferably from 2 to 6 carbon atoms. From the viewpoint of excellent thermal stability, the fluoroalkenyl group with at least 2 carbon atoms, having an etheric oxygen atom between carbon-carbon atoms, is preferably a perfluoroalkenyl group with at least 2 carbon atoms, having an etheric oxygen atom between carbon-carbon atoms, particularly preferably a perfluoroalkenyl group with from 2 to 6 carbon atoms, having an etheric oxygen atom between carbon-carbon atoms.

Specific examples of the units (3) may be the following units.

$-[CH_2-CH_2]-$, $-[CF_2-CF(CF_3)]-$, $-[CH_2-CF(CF_3)]-$, $-[CF_2-CF(OCF_3)]-$, $-[CF_2-CF(OCF_2CF_3)]-$, $-[CF_2-CF(O(CF_2)_2CF_3)]-$, $-[CF_2-CF(O(CF_2)_3CF_3)]-$, $-[CF_2-CF(OCF_2CF(CF_3)O(CF_2)_2CF_3)]-$, $-[CF_2-CF((CF_2)_4CF=CF_2)]-$, $-[CF_2-CF((CF_2)_5CF=CF_2)]-$, $-[CF_2-CF((CF_2)_6CF=CF_2)]-$.

From such a viewpoint that the glass transition temperature of the fluorinated polymer will be lowered so that the flowability will be excellent and the moldability will be excellent and from such a viewpoint that at the time of curing the fluorinated polymer, by at least one of heating and active energy ray irradiation, the mobility will be high and a crosslinking reaction among molecules will be facilitated, the units (3) are preferably $-[CH_2-CH_2]-$, $-[CF_2-CF(CF_3)]-$, $-[CF_2-CF(OCF_3)]-$, $-[CF_2-CF(O(CF_2)_2CF_3)]-$ or $-[CF_2-CF(OCF_2CF(CF_3)O(CF_2)_2CF_3)]-$.

The fluorinated polymer may contain one type of the units (3) alone, or two or more types of the units (3) in combination.

The units (3) can be formed by polymerizing the compound (31) as a monomer.

$$CX^3X^4=CY^1Y^2 \qquad (31)$$

In the formula (31), $X^3$, $X^4$, $Y^1$ and $Y^2$ are as defined in the formula (3), and their examples and preferred ranges are also the same.

(Preferred Embodiments of Fluorinated Polymer)

The proportion of groups represented by $-COZ^1$ in the fluorinated polymer of the present invention is preferably from 0.022 to 7.1 mmol/g, more preferably from 0.1 to 4 mmol/g, further preferably from 0.1 to 3 mmol/g, particularly preferably from 0.2 to 1 mmol/g, based on the mass of the fluorinated polymer. Here, the proportion of groups represented by $-COZ^1$ is the total proportion of $-CONR^1NR^2H$, $-CONR^3OR^4$ and $-COOR^5$. When it is at least the lower limit value in the above range, the solubility in alcohol will be further improved. When it is at most the upper limit value in the above range, at the time of curing the fluorinated polymer by active energy ray irradiation, it is possible to avoid curing only at the surface, and it is possible to suppress formation of bubbles in the cured product. At the time of curing the fluorinated polymer by heating, it is possible to suppress formation of bubbles in the cured product.

In the fluorinated polymer of the present invention, the proportion of units wherein $Z^1$ is $NR^1NR^2H$, is preferably from 0.02 to 2 mmol/g, more preferably from 0.02 to 1 mmol/g, particularly preferably from 0.2 to 0.5 mmol/g, based on the mass of the fluorinated polymer. When it is at least the lower limit value in the above range, the solubility in an alcohol will be more excellent. When it is at most the upper limit value in the above range, at the time of curing the fluorinated polymer by active energy ray irradiation, it is possible to avoid curing only at the surface, and formation of bubbles in the cured product will be less. At the time of curing the fluorinated polymer by heating, formation of bubbles in the cured product will be less.

In the fluorinated polymer of the present invention, the proportion of units wherein $Z^1$ is $NR^3OR^4$ is preferably from 0.1 to 4 mmol/g, more preferably from 0.2 to 3 mmol/g, particularly preferably from 0.3 to 1 mmol/g, based on the mass of the fluorinated polymer. When it is at least the lower limit value in the above range, the solubility in an alcohol will be more excellent. When it is at most the upper limit value in the above range, at the time of curing the fluorinated polymer by active energy ray irradiation, it is possible to avoid curing only at the surface, and formation of bubbles in the cured product will be less. At the time of curing the fluorinated polymer by heating, formation of bubbles in the cured product will be less.

In a case where the fluorinated polymer contains units wherein $Z^1$ is $NR^1NR^2H$ and units wherein $Z^1$ is $OR^5$, in the fluorinated polymer, the proportion of units wherein $Z^1$ is $NR^1NR^2H$ is not particularly limited so long as satisfying the above-mentioned proportion of groups represented by $-COZ^1$, but is preferably from 1 to 90 mol %, more preferably from 5 to 70 mol %, particularly preferably from 10 to 60 mol %, based on the total 100 mol % of units wherein $Z^1$ is $NR^1NR^2H$ and units wherein $Z^1$ is $OR^5$. When the proportion of units wherein $Z^1$ is $NR^1NR^2H$ is at least the lower limit value in the above range, the fluorinated polymer maintains the solubility in an alcohol and can be cured by heating or active energy ray irradiation. When it is at most the upper limit value in the above range, at the time of curing the fluorinated polymer by active energy ray irradiation, it is possible to avoid curing only at the surface, and formation of bubbles in the cured product will be less.

In the fluorinated polymer, the proportion of groups represented by $-COZ^1$ in the units (1) can be calculated by the $^{19}F$-NMR measurements.

In all units in the fluorinated polymer, the proportion of the units (1) is preferably from 1 to 100 mol %, more preferably from 3 to 98 mol %, further preferably from 3 to 50 mol %, particularly preferably from 5 to 15 mol %. When the proportion of the units (1) is at least the lower limit value in the above range, the solubility in an alcohol will be more excellent. When the proportion of the units (1) is at most the upper limit value in the above range, at the time of curing the fluorinated polymer by active energy ray irradiation, it is possible to avoid curing only at the surface, and formation of bubbles in the cured product will be less. At the time of curing the fluorinated polymer by heating, formation of bubbles in the cured product will be less.

A preferred embodiment of the fluorinated polymer is a fluorinated polymer comprising units (1), units (2) and units (3), and in all units in the fluorinated polymer, the proportion of units (1) is from 1 to 98 mol %, the proportion of units (2) is from 1 to 95 mol % and the proportion of units (3) is from 1 to 95 mol %.

The contents of units (1) to units (4) in the fluorinated polymer can be calculated by the $^{19}$F-NMR and $^1$H-NMR measurements.

(Molecular Weight)

The mass-average molecular weight of the fluorinated polymer of the present invention is preferably from 3,000 to 200,000. Among these, in a case where the mass average molecular weight of the fluorinated polymer is at most 10,000, the viscosity is from 1 to 10,000 Pa·s, and by heating to from 25 to 100° C., the viscosity becomes at most 10 Pa·s, whereby the polymer flows by its own weight. If the mass average molecular weight exceeds 10,000, the viscosity becomes high at a level of at least 10,000 Pa·s at 25° C., and in order to let it flow, it becomes necessary to heat it at a temperature of from 100 to 150° C. Further, if the mass average molecular weight exceeds 20,000, it becomes necessary to let it flow by exerting a pressure of from 0.1 to 10 MPa.

In the case of molding the fluorinated polymer by casting or the like, the mass average molecular weight of the fluorinated polymer is preferably from 3,000 to 20,000, particularly preferably from 5,000 to 15,000. When the mass average molecular weight of the fluorinated polymer is at least the lower limit value in the above range, the cross-linked cured product tends to be excellent in mechanical strength and heat resistance, and when it is at most the upper limit value in the above range, fluidity tends to be secured at the time of molding. In particular, at the time of sealing of an SMD type (an LED module provided with a cup-shaped reflector), the fluidity becomes important, and the fluorinated polymer having a mass average molecular weight in this range is preferred.

In the case of using by processing a molded product such as a sheet of the fluorinated polymer, the mass average molecular weight of the fluorinated polymer is preferably from 20,000 to 200,000, particularly preferably from 30,000 to 100,000. For example, at the time of sealing of a COB type (one having no reflector, i.e. a plurality of elements are collectively sealed by a sealing resin), there may be a case where heat sealing is conducted by using a sheet-form sealing resin. In such a case, sealing may be conducted by superimposing the sheet-form fluorinated polymer on a substrate on which the LED elements are mounted, and heat-fluidizing it at from 100 to 150° C. to cover the elements with the fluorinated polymer, followed by cross-linking. In order to carry out sealing without leaving gaps or bubbles at that time, it is preferred to exert a pressure to the sheet for covering. When the mass-average molecular weight is at least 20,000, the polymer will maintain the shape without flowing at room temperature, and will have no stickiness, whereby handling will be easy, and it is possible to seal the LED elements by letting it flow by pressuring and heating. When the mass average molecular weight is at most 200,000, the temperature required for fluidizing will not be too high, and it is possible to avoid an undesirable influence on e.g. the elements.

The mass average molecular weight can be obtained by gel permeation chromatography (GPC), as a molecular weight calculated as PMMA (polymethyl methacrylate).

[Method for Producing Fluorinated Polymer]

The fluorinated polymer is obtainable by a method of reacting a fluorinated polymer comprising units represented by the following formula (1a) (hereinafter referred to also as "units (1a)"), with at least one compound selected from the group consisting of a hydrazine compound of the following formula (5) (hereinafter referred to also as "the hydrazine compound" and a hydroxylamine compound represented by the following formula (6) (hereinafter referred to also as "the hydroxylamine compound"):

in the formula (1a), $X^1$, $X^2$, $Q^1$, $R^{f1}$ and $R^5$ are as defined in the formula (1), and their examples and preferred ranges are also the same, in the formula (5), $R^1$ and $R^2$ are as defined in the formula (1), and their examples and preferred ranges are also the same, and in the formula (6), $R^3$ and $R^4$ are as defined in the formula (1), and their examples and preferred ranges are also the same.

In a case where a fluorinated polymer comprises units wherein $Z^1$ is $NR^1NR^2H$, such a fluorinated polymer is obtainable by reacting a fluorinated polymer comprising units (1a) with the hydrazine compound. In a case where a fluorinated polymer comprises units wherein $Z^1$ is $NR^3OR^4$, such a fluorinated polymer is obtainable by reacting a fluorinated polymer comprising units (1a) with the hydroxylamine compound. In these cases, by quantifying the remaining —$COOR^5$ groups by the infrared spectroscopy (IR), it is possible to measure the proportion of units wherein $Z^1$ is $NR^1NR^2H$ or units wherein $Z^1$ is $NR^3OR^4$.

In a case where a fluorinated polymer comprises units wherein $Z^1$ is $NR^1NR^2H$, units wherein $Z^1$ is $NR^3OR^4$ and units wherein $Z^1$ is $OR^5$, methods for producing such a fluorinated polymer may specifically be as follows.

(a) A fluorinated polymer comprising units (1a) is reacted with the hydrazine compound and then with the hydroxylamine compound.

(b) A fluorinated polymer comprising units (1a) is reacted with the hydroxylamine compound and then with the hydrazine compound.

(c) A fluorinated polymer comprising units (1a) is reacted with the hydroxylamine compound and the hydrazine compound.

(Fluorinated Polymer Comprising Units Represented by the Formula (1a))

Units (1a) correspond to units (1) wherein $Z^1$ is other than $NR^1NR^2H$ and $NR^3OR^4$. The fluorinated polymer comprising units (1a) may further contain the above-mentioned units (2), units (3) and units (4). In the fluorinated polymer comprising units (1a), the proportions of the units (1a), the units (2), the units (3) and the units (4) are, including preferred ones, the same as described above with respect to the units (1), the units (2), the units (3) and the units (4). In the fluorinated polymer comprising units (1a), the proportion of —$COOR^5$ is, including preferred ones, the same as described above with respect to the proportion of —$COZ^1$.

The fluorinated polymer comprising units (1a) is obtainable by polymerizing a monomer to form the above-mentioned units by a known method (for example, a method described in WO2015/098773).

(Hydrazine Compound Represented by the Formula (5))

As the hydrazine compound, hydrazine, hydrazine monohydrate, methylhydrazine or 1,2-dimethylhydrazine may be mentioned, and from the viewpoint of safety and more excellent solubility of the obtainable fluorinated polymer in an alcohol, hydrazine monohydrate is preferred. The hydrazine compound may be subjected, in the form of an aqueous solution or in the form of a salt, to the reaction with the fluorinated polymer comprising units (1a). As the hydrazine compound, a commercial product may be employed.

(Hydroxylamine Compound Represented by the Formula (6))

As the hydroxylamine compound, hydroxylamine, N-methylhydroxylamine, N,O-dimethylhydroxylamine or isopropylhydroxylamine may be mentioned, and from such a viewpoint that the obtainable fluorinated polymer will be more excellent in solubility in an alcohol, hydroxylamine is preferred. The hydroxylamine compound may be subjected, in the form of an aqueous solution or in the form of a salt, to the reaction with the fluorinated polymer comprising units (1a), but the form of an aqueous solution is preferred from the viewpoint of safety. As the hydroxylamine compound, a commercial product may be employed.

(Reaction Conditions)

At least one compound selected from the group consisting of the hydrazine compound and the hydroxylamine compound, is not particularly limited so long as a fluorinated compound with the desired amount of —$COZ^1$ is obtainable, but is in an amount of preferably from 0.1 to 20 mol, more preferably from 0.3 to 15 mol, particularly preferably from 0.5 to 10 mol, to 1 mol of the groups represented by —$COOR^5$ in the fluorinated polymer comprising units (1a).

The reaction may be carried out in the presence of a solvent. The solvent is preferably capable of dissolving raw material components (the fluorinated polymer comprising units (1a), the hydroxylamine compound, the hydrazine compound), but it is preferred to use a solvent in which at least the fluorinated polymer comprising units (1a) is soluble. The solvent may, for example, be a fluorinated solvent, an ether solvent or an ester solvent, and it may be suitably selected for use depending upon e.g. the polarity of raw material components, etc. Further, it is also possible to add an alcohol as the reaction proceeds. Here, the alcohol is as described above with respect to the fluorinated polymer.

A fluorinated solvent is a solvent which comprises fluorine and carbon and may optionally contain chlorine, oxygen and hydrogen, and may, for example, be a fluorinated alkane, a fluorinated aromatic compound, a fluoroalkyl ether, a fluorinated alkylamine, a fluoroalcohol, etc.

As the fluorinated alkane, a compound having from 4 to 8 carbon atoms is preferred. Commercial products may, for example, be $CF_3CH_2CF_2H$(HFC-245fa), $CF_3CH_2CF_2CH_3$ (HFC-365mfc), perfluorohexane, 1H-perfluorohexane, perfluorooctane, $C_6F_{13}H$ (manufactured by Asahi Glass Company, Limited, ASAHIKLIN (registered trademark) AC-2000), $C_6F_{13}C_2H_5$ (manufactured by Asahi Glass Company, Limited, ASAHIKLIN (registered trademark) AC-6000), $C_2F_5CHFCHFCF_3$ (manufactured by Chemours Co., Vertrel (registered trademark) XF), etc. The fluorinated aromatic compound may, for example, be hexafluorobenzene, trifluoromethylbenzene, perfluorotoluene, bis(trifluoromethyl) benzene. etc. The fluoroalkyl ether compound is preferably a compound having from 4 to 12 carbon atoms. Commercial products may, for example, be $CF_3CH_2OCF_2CF_2H$ (manufactured by Asahi Glass Company, Limited, ASAHIKLIN (registered trademark) AE-3000), $C_4F_9OCH_3$ (manufactured by 3M Co., Novec (registered trademark) 7100), $C_4F_9OC_2H_5$ (manufactured by 3M Co., Novec (registered trademark) 7200), $C_2F_5CF(OCH_3)C_3F_7$ (manufactured by 3M Co., Novec (registered trademark) 7300), etc. The fluorinated alkylamine may, for example, be perfluorotripropylamine, perfluorotributylamine, etc. The fluoroalcohol may, for example, be 2,2,3,3-tetrafluoropropanol, 2,2,2-trifluoroethanol, hexafluoroisopropanol, etc. Further, dichloropentafluoropropane (HCFC-225), perfluoro(2-butyltetrahydrofuran), etc. may be mentioned. Dichloropentafluoropropane is available as a commercial product AK-225 (manufactured by Asahi Glass Company, Limited).

The ether solvent may, for example, be ethylene glycol dimethyl ether, ethylene glycol diethyl ether, diethylene glycol dimethyl ether, diisopropyl ether, ethylene glycol monomethyl ether, ethylene glycol monoethyl ether, ethylene glycol monobutyl ether, propylene glycol monomethyl ether, propylene glycol dimethyl ether, etc.

The ester solvent may, for example, be methyl acetate, ethyl acetate, n-propyl acetate, isopropyl acetate, n-butyl acetate, isobutyl acetate, etc.

The reaction is conducted, for example, by dissolving the fluorinated polymer comprising units (1a) in the above solvent, and adding, at from 0 to 30° C., at least one compound selected from the group consisting of the hydrazine compound and the hydroxylamine compound. After the addition, by heating at a temperature of from 30 to 100° C. and conducting the reaction for from 1 minute to 10 hours, it is possible to obtain the desired fluorinated polymer.

[Curable Composition, Coating Composition]

A cured product to be formed from the fluorinated polymer of the present invention can be produced by using only the above-mentioned fluorinated polymer. Further, it may be produced from a curable composition comprising the above-mentioned fluorinated polymer (but not containing a solvent) or from a coating composition comprising such a curable composition and a solvent.

In the curable composition, components other than the fluorinated polymer may, for example, be inorganic particles, a silane coupling agent, a fluoropolyether compound, etc. Here, a silane coupling agent and a fluoropolyether compound may, for example, be those described in WO2015/098773.

As the inorganic particles, metal oxides such as silica, titania, zirconia, alumina, etc. and various phosphor particles, are preferred. The diameter of the inorganic particles is not particularly limited, but is preferably from 1 to 100 nm, and from the viewpoint of ensuring the transparency of the composition by suppressing light scattering, it is particularly preferably from 1 to 20 nm. The content of the inorganic particles is, from such a viewpoint that the refractive index of a cured product to be formed from the obtainable fluorinated polymer will be increased, preferably from 20 to 200 parts by mass, particularly preferably from 50 to 100 parts by mass, per 100 parts by mass of the fluorinated polymer. When the content of the inorganic particles is at least the lower limit value in the above range, the refractive index will be more increased. When it is at most the upper limit value in the above range, moldability will be excellent.

The solvent in the coating composition may be an alcohol, and may further contain a solvent other than the alcohol. The solvent other than the alcohol is preferably one exemplified as the solvent for producing the fluorinated polymer (but excluding an alcohol).

The solid content in the coating composition is preferably from 1 to 99 mass %. The fluorinated polymer in the coating composition is preferably from 1 to 99 mass %. The solvent amount in the coating composition is preferably from 99 to 1 mass %. The content of an alcohol in the solvent is preferably from 50 to 99 mass %.

[Method for Producing Cured Product to be Formed from Fluorinated Polymer]

A cured product to be formed from the fluorinated polymer in the present invention, is produced by a method which comprises subjecting the fluorinated polymer to at least one of heating and active energy ray irradiation. A cured product to be formed from the fluorinated polymer, is preferably produced by a method which comprises producing a molded product made of the fluorinated polymer or a molded product made of a curable composition comprising the fluorinated polymer, and then subjecting the molded product to one of heating and active energy ray irradiation. In the case of active energy ray irradiation, as compared with the case of producing a cured product by heating the molded product, it is possible to obtain a cured product at a lower temperature. Further, it is preferred that in such a case that the curing reaction is carried out on a substrate, the type of the substrate, particularly the heat resistance of the substrate, is not limited. In a case where both the heating and the active energy ray irradiation are conducted, the heating may be carried out before, at the same time as, or after, the irradiation with active energy rays.

In a case where the fluorinated polymer of the present invention comprises, as units (1), units wherein $Z^1$ is $NR^1NR^2H$ and units wherein $Z^1$ is $OR^5$, it can be cured by at least one of heating and active energy ray irradiation. In a case where the fluorinated polymer of the present invention comprises, as units (1), units wherein $Z^1$ is $NR^3OR^4$, it can be cured by active energy ray irradiation.

(Method for Producing Molded Product)

The molded product can be produced by using the curable composition or the coating composition. At the time of producing a thin film-form molded product or a thin film-form molded product integrated with a substrate, it is preferred to use the coating composition. The method of using the curable composition may, for example, be a method of fluidizing by heating, followed by casting into a predetermined shape in a mold, a method of casting on the surface of a die to form a sheet-form or film-form molded product, a method of molding into a predetermined shape by extrusion molding, transfer molding or the like, or a method of conducting secondary processing such as cutting, bending, etc. of a molded sheet or film into a predetermined shape.

In the case of producing a cured product formed from the fluorinated polymer integrated with a substrate, it is possible to produce a cured product formed from the fluorinated polymer integrated with a substrate, by a method of conducting molding by using the substrate as the above die, and cross-linking the molded product without separating the molded product from the substrate. Further, it is possible to produce a cured product formed from the fluorinated polymer integrated with a substrate, by secondary processing such as a method of overlapping a molded sheet or film on the substrate, followed by pressing to form a laminate. This is a method suitable at the time of producing a thin film-form molded product or a thin film-form molded product integrated with a substrate, such as a transparent sealed LED.

As the method of applying the coating composition, a spin coating method, a wipe coating method, a spray coating method, a squeegee coating method, a dip coating method, a die coating method, an ink-jet method, a flow coating method, a roll coating method, a casting method, a Langmuir-Blodgett method, a gravure coating method, etc. may be mentioned.

(Heating)

The temperature for the heating is not particularly limited, but is preferably from 100 to 200° C., particularly preferably from 120 to 180° C. The time for the heating is not particularly limited, but is preferably from 10 minutes to 10 hours, particularly preferably from 30 minutes to 4 hours. A method of raising the temperature stepwise is also effective.

In a case where the fluorinated polymer of the present invention comprises, as units (1), units wherein $Z^1$ is $NR^1NR^2H$ and units wherein $Z^1$ is $OR^5$, it is considered that by the heating, a reaction represented by the following formula [I] takes place to form a cross-linked structure ($-Q^1-R^{f1}-CONR^1NR^2CO-R^{f1}-Q^1-$). Thus, the fluorinated polymer is considered to be cross-linked and cured. In the fluorinated polymer in the present invention, no cross-linking reaction by the heating is considered to take place among units wherein $Z^1$ is $OR^5$ or among units wherein $Z^1$ is $NR^1NR^2H$.

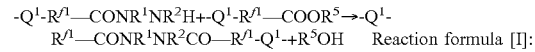

$-Q^1-R^{f1}-CONR^1NR^2H+-Q^1-R^{f1}-COOR^5\rightarrow -Q^1-R^{f1}-CONR^1NR^2CO-R^{f1}-Q^1-+R^5OH$    Reaction formula [I]:

(Active Energy Ray Irradiation)

The wavelength of active energy rays is preferably from 150 to 300 nm, particularly preferably from 200 to 260 nm. The generation source of active energy rays may, for example, be a metal halide lamp for from 250 to 300 nm, a low-pressure mercury lamp for 185 and 254 nm, an excimer lamp for 172 nm and 222 nm, a KrF excimer laser for 248 nm, an ArF excimer laser for 193 nm, or a $F_2$ laser for 157 nm.

By adjusting the irradiation time in accordance with the irradiation intensity of active energy rays, it is possible to produce a cured product formed from the fluorinated polymer. For example, the crosslinking can be carried out by irradiation with an irradiation intensity of from 0.1 to 500 mW/cm² for from about 1 minute to 10 hours. By irradiating active energy rays with the above-specified wavelengths, it is possible to let the crosslinking reaction proceed without using a photoinitiator.

In a case where the fluorinated polymer of the present invention comprises, as units (1), units wherein $Z^1$ is $NR^3OR^4$, it is considered that by irradiation of active energy rays, a de-$CONR^3OR^4$ reaction takes place as represented by the following reaction formula [II], to form $-Q^1-R^{f1}-$ radicals, and intermolecular two $-Q^1-R^{f1}-$ radicals are reacted to form a crosslinked structure ($-Q^1-R^{f1}-R^{f1}-Q^1-$). Thus, the fluorinated polymer is considered to be cross-linked and cured.

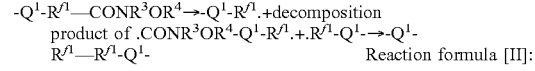

$-Q^1-R^{f1}-CONR^3OR^4\rightarrow -Q^1-R^{f1}.+$decomposition product of $.CONR^3OR^4-Q^1-R^{f1}.+.R^{f1}-Q^1-\rightarrow -Q^1-R^{f1}-R^{f1}-Q^1-$    Reaction formula [II]:

In a case where the fluorinated polymer of the present invention comprises, as units (1), units wherein $Z^1$ is $NR^1NR^2H$ and units wherein $Z^1$ is $OR^5$, it is considered that by irradiation of active energy rays, a de-$COOR^5$ reaction takes place as represented by the following reaction formula [III], and in the same manner as in the reaction formula [II], a crosslinked structure is formed. Thus, the fluorinated polymer is considered to be cross-linked and cured. Here, units wherein $Z^1$ is $NR^1NR^2H$ are considered to be not involved in the crosslinking reaction by active energy ray irradiation and not to inhibit the cross-linking reaction of other units (for example, units wherein $Z^1$ is $OR^5$).

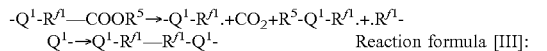
Reaction formula [III]:

Here, in the crosslinking reaction, all —$COZ^1$ in the fluorinated polymer may be reacted, or all may not be reacted.

[Cured Product to be Formed from Fluorinated Polymer]

In a cured product to be formed from the fluorinated polymer, a functional group that absorbs ultraviolet light of from 300 to 400 nm is not present, whereby the light transmittance of from 300 to 400 nm is high. Further, it has the crosslinked structure, whereby the strength is excellent. Thus, it is useful as a light-transmitting sealant for UV-LED as an alternative to a high-pressure mercury lamp having emission wavelengths of e.g. 313, 365 and 405 nm. Usually the sealing thickness for UV-LED is about 0.5 mm, whereby the transmittance at 365 nm of a sheet with a thickness of 0.5 mm of the cured product, is required to be at least 70%, preferably at least 80%, particularly preferably at least 90%.

EXAMPLES

Now, the present invention will be described in detail with reference to Examples and Comparative Examples. However, the present invention is not limited by the following description. Ex. 1 to 5 are Examples of the present invention. Evaluations in each Ex. were in accordance with the following methods.

[Evaluation Methods]

(Mass Average Molecular Weight)

The mass average molecular weight of a fluorinated polymer was calculated as a molecular weight calculated as PMMA (polymethylmethacrylate) by gel permeation chromatography (GPC), by using $CF_2ClCF_2CHClF$ (manufactured by Asahi Glass Company, Limited, trade name: AK-225cb) as the solvent for fluorinated polymer P1, or using tetrahydrofuran as the solvent for fluorinated polymers Q1 and R1.

(Content of —$COOCH_3$ Groups in Fluorinated Polymer)

The content of —$COOCH_3$ groups in a fluorinated polymer was obtained from $^{19}$F-NMR.

(Peel Strength)

A fluorinated polymer was dissolved, in AC-2000 in the case of fluorinated polymer P1, in methanol in the case of fluorinated polymer P2 or P3, or in monoglyme in the case of fluorinated polymer Q1, R1 or Q3, to prepare a fluorinated polymer solution having a concentration of 15 mass %. The solution was cast on a slide glass (manufactured by Matsunami Glass Ind., Ltd. Micro slide glass SO313 Shiroitamigaki) and then naturally dried at room temperature for 2 hours. Then, the solvent was volatilized by heating to raise the temperature stepwise to 150° C. over about 3 hours, to produce a film having a thickness of about 80 µm. The film was cut in a width of 1 cm, and the peel strength was measured by a 90-degree peel test. By peeling off a portion with a length of about 2 cm at a peeling speed of 15 mm/min., the 90 degree peel strength was obtained from an average value of a portion that was deemed to become a steady state.

(Elastic Modulus)

Using a film produced in each Ex., the elastic modulus was measured by Viscoelasticity Analysis Mode of TMA/EXSTAR SS7100, manufactured by Hitachi High-Technologies Corporation. Measurement temperature range: −40° C. to 150° C., temperature raising rate: 5° C./min, frequency: 0.05 Hz.

(Solubility in Methanol)

To 0.5 g of methanol, a fluorinated polymer was added in such an amount that the content of the fluorinated polymer became 5 mass %, followed by mixing at a temperature of 40° C. for 1 hour, whereupon the mixture was cooled to room temperature (25° C.). The obtained mixture was judged as to whether or not 1 mL of the mixture was filterable without clogging through a filter made of PTFE (polytetrafluoroethylene) with a pore size of 0.5 µm and a diameter of 25 mm. Being filterable was judged as "dissolved", and being not filterable was judged as "not dissolved".

(Adhesion and Chemical Resistance)

A fluorinated polymer was dissolved in methanol, to prepare a methanol solution wherein the fluorinated polymer was 10 mass %. At a central portion of a stainless steel plate of 5 cm square and 1 mm in thickness, said solution was applied to form two straight lines of 3 mm in width, 3 cm in length and 5 mm in distance, and naturally dried to prepare a coating film. A quartz plate of 2.5 cm×4 cm and 1 mm in thickness, was bonded via the coating film, heated at 150° C. for 30 minutes, and then, subjected to UV irradiation for one hour with light intensity of 8 mW/cm² by using the above-mentioned low-pressure mercury lamp, to prepare three composite plates each having the stainless plate and the quartz plate bonded to each other. The composite plates were immersed, one by one, in water at 60° C., in ethanol at 50° C. or in methyl acetate at 50° C., and held for 24 hours, whereupon the presence or absence of peeling between the stainless steel plate and the quartz plate was confirmed. Judgement was made as to whether or not there is no peeling at all in three composite plates, and whether or not there is peeling in at least one of them. A case where there was no peeling in all three, was taken that the adhesion and chemical resistance were "present".

[Units]

Units to be referred to in the following Production Examples are as follows.

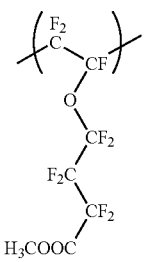

(a1)

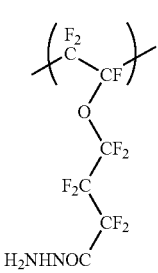

(a2)

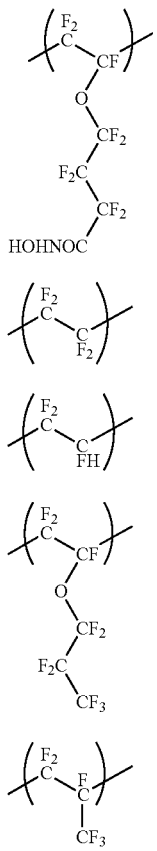

(a3)

(b1)

(b2)

(c1)

(c2)

Production Example 1: Production of Fluorinated Polymer P1

Into a stainless steel autoclave with an internal capacity of 200 mL and equipped with a stirrer, 0.1 g of V601 (manufactured by Wako Pure Chemical Industries, Ltd.) was charged as a polymerization initiator, followed by deaeration under reduced pressure, and then, 20 g of $CF_2$=$CFOCF_2CF_2CF_2COOCH_3$, 40 g of $CF_2$=$CFOCF_2CF_2CF_3$ (hereinafter referred to also as "PPVE") and 103 g of AC-2000 were charged. After injecting 12 g of tetrafluoroethylene (TFE) with stirring, polymerization was initiated by raising the inner temperature to 80° C. Polymerization was carried out for 6 hours while adding TFE while maintaining the pressure to be 0.72 MPa, whereby the total charged amount of TFE was 28.3 g.

After cooling the autoclave, the content was transferred to a 500 mL glass beaker, and while stirring, 200 g of methanol was added to precipitate a copolymer. After removing the supernatant, drying was carried out to obtain 20.6 g of fluorinated polymer P1. The fluorinated polymer P1 was soluble in AK-225cb or AC-2000, and was insoluble in methanol, acetone or tetrahydrofuran (THF). The unit composition of the fluorinated polymer P1 was units (a1):units (b1):units (c1)=8:76:16 (molar ratio), and the mass average molecular weight was 21,500.

Production Example 2: Production of Fluorinated Polymer Q1

Into a stainless steel autoclave with an internal capacity of 200 mL and equipped with a stirrer, 0.4 g of V601 (manufactured by Wako Pure Chemical Industries, Ltd.) was charged as a polymerization initiator, followed by deaeration under reduced pressure, and then, 2 g of $CF_2$=$CFOCF_2CF_2CF_2COOCH_3$, 26 g of PPVE and 159 g of AC-2000 were charged. After injecting 13 g of trifluoroethylene (TrFE) with stirring, the internal temperature was raised to 70° C., and polymerization was carried out for 4 hours, whereby the pressure was reduced from 0.71 MPa to 0.53 MPa.

After cooling the autoclave, the content was transferred to a 500 mL glass beaker, and while stirring, 200 g of hexane was added to precipitate a copolymer. After removing the supernatant, drying was carried out to obtain 7.7 g of fluorinated polymer Q1. The fluorinated polymer Q1 was soluble in acetone, methyl ethyl ketone, methyl acetate, tetrahydrofuran (THF) or 1,2-dimethoxyethane (monoglyme), and was insoluble in AK-225cb, AC-2000, hexane, methanol or ethanol. The unit composition of the fluorinated polymer Q1 was units (a1):units (b2):units (c1)=4:78:18 (molar ratio), and the mass average molecular weight was 36,300.

Production Example 3: Production of Fluoropolymer R1

Into a stainless steel autoclave with an internal capacity of 200 mL and equipped with a stirrer, 0.1 g of V601 (manufactured by Wako Pure Chemical Industries, Ltd.) was charged as a polymerization initiator, followed by deaeration under reduced pressure, and then, 8 g of $CF_2$=$CFOCF_2CF_2CF_2COOCH_3$ was charged. After injecting 150 g of hexafluoropropylene (HFP), 42 g of TrFE was further injected while stirring. The internal temperature was raised to 70° C., and polymerization was carried out for 4 hours, whereby the pressure was reduced from 2.88 MPa to 2.85 MPa.

After cooling the autoclave, the content was transferred to a 500 mL glass beaker, and while stirring, 200 g of hexane was added to precipitate a copolymer. After removing the supernatant, drying was carried out to obtain 3.0 g of fluorinated polymer R1. The fluorinated polymer R1 was soluble in acetone, methyl ethyl ketone, methyl acetate, THF or monoglyme, and was insoluble in AK-225cb, AC-2000, hexane, methanol or ethanol. The unit composition of the fluorinated polymer R1 was units (a1):units (b2):units (c2) =2:89:9 (molar ratio), and the mass average molecular weight was 60,900.

Ex. 1: Production of Fluorinated Polymer P2

After dissolving 1 g of the fluorinated polymer P1 in 6 g of AC-2000, 0.12 g of a solution having hydrazine monohydrate (purity: 79%, manufactured by Tokyo Chemical Industry Co., Ltd.) diluted 5 times with methanol, was added and stirred vigorously. After stirring for 1 hour at room temperature, 2 g of methanol was added, followed by further heating at 40° C. for 2 hours. A part of the reaction solution was cast on a glass plate and heated at 60° C. to evaporate the solvent, to produce a film having a thickness of 10 µm. Infrared absorption (IR) was measured, whereby formation of units (a2) was confirmed from such results that the absorption at 1,794 $cm^{-1}$ based on C=O in the —$COOCH_3$ group in the units (a1) was decreased to about ½, and an absorption at 1,718 $cm^{-1}$ based on C=O in the —$CONHNH_2$ group was newly formed. When methanol was added to the reaction solution in the same manner as for the fluorinated polymer P1 in Production Example 1, the polymer was not precipitated, and therefore, hexane was added, whereby the polymer was precipitated. The precipitated polymer was vacuum dried at 60° C., to obtain 0.82 g of fluorinated polymer P2.

The obtained film was heated at 150° C. for 3 hours, and then peeled from the glass plate and dipped again in methanol, whereby it was insoluble while swelled. The modulus of elasticity was measured, whereby a decrease corresponding to the glass transition temperature (Tg) was observed in the vicinity of 10° C., and at a temperature above Tg, a rubber-like plateau region which was substantially constant up to at least 150° C. was observed, and thus, it was confirmed that a crosslinking reaction took place by heating at 150° C.

The obtained film was subjected to UV irradiation for two hours with a light intensity of 8 mW/cm$^2$ by using a low-pressure mercury lamp (manufactured by Sen Light Corporation), and then peeled from the glass plate. The modulus of elasticity was measured, whereby a rubber-like plateau region was observed, and thus, it was confirmed that a crosslinking reaction took place also by UV irradiation.

Ex. 2: Production of Fluorinated Polymer Q2

After dissolving 1 g of the fluorinated polymer Q1 in 6 g of monoglyme, 0.08 g of a solution having hydrazine monohydrate (purity: 79%, manufactured by Tokyo Chemical Industry Co., Ltd.) diluted 5 times with methanol, was added and stirred vigorously. After stirring at room temperature for 1 hour, heating was further conducted at 40° C. for 2 hours. A part of the reaction solution was cast on a glass plate and heated at 60° C. to evaporate the solvent, to produce a film having a thickness of 10 μm. IR measurements were conducted in the same manner as in Ex. 1, whereby formation of units (a2) was confirmed from such results that the absorption at 1,794 cm$^{-1}$ was decreased to about ½, and an absorption at 1,718 cm$^{-1}$ was newly formed. Hexane was added to the reaction solution, and the precipitated polymer was vacuum dried at 60° C., to obtain 0.87 g of fluorinated polymer Q2.

The obtained film was heated at 150° C. for 3 hours, and then, peeled from the glass plate and immersed again in methanol, whereby it was insoluble while swelled. The modulus of elasticity was measured, whereby a decrease corresponding to Tg was observed in the vicinity of 5° C., and at a temperature above Tg, a rubber-like plateau region which was substantially constant up to at least 150° C. was observed, and thus, it was confirmed that a cross-linking reaction took place by heating at 150° C.

The obtained film was subjected to UV irradiation for 2 hours with a light intensity of 8 mW/cm$^2$ by using the above-mentioned low-pressure mercury lamp and then, peeled from the glass plate. The dynamic viscoelasticity was measured, whereby a rubber-like plateau region was observed, and thus, it was confirmed that a crosslinking reaction took place by UV irradiation.

Ex. 3: Production of Fluorinated Polymer P3

After dissolving 1 g of the fluorinated polymer P1 in 5 g of AC-2000, 0.30 g of a solution having 50% hydroxylamine aqueous solution (manufactured by Wako Pure Chemical Industries, Ltd.) diluted 5 times by methanol, was added and stirred vigorously. After stirring at room temperature for 1 hour, 3 g of methanol was added, followed by further heating at 40° C. for 2 hours. A part of the reaction solution was cast on a glass plate and heated at 60° C. to evaporate the solvent to produce a film having a thickness of 10 μm. IR measurements were conducted in the same manner as in Ex. 1, whereby the absorption at 1,794 cm$^{-1}$ based on the —COOCH$_3$ group in units (a1) was almost disappeared, and changed to broad absorptions in the vicinity of 1,740 cm$^{-1}$ and in the vicinity of 1,650 cm$^{-1}$ based the —CONHOH group, and thus, it was confirmed that a fluorinated polymer P3 having a structure wherein units (a1) were all replaced by units (a3), was formed. The polymer precipitated by addition of hexane to the reaction solution, was vacuum dried at 60° C., to obtain 0.85 g of fluorinated polymer P3.

The obtained film was subjected to UV irradiation for 2 hours at a light intensity of 8 mW/cm$^2$ by using the above-mentioned low-pressure mercury lamp, and then, peeled from the glass plate and immersed in methanol or in AC-2000, whereby it was insoluble. The modulus of elasticity was measured, whereby a decrease corresponding to Tg was observed in the vicinity of 10° C., and at a temperature above 10° C., a rubber-like plateau region which was substantially constant up to at least 150° C. was observed, and thus, it was confirmed that the crosslinking reaction took place by UV irradiation.

Ex. 4: Production of Fluorinated Polymer Q3

After dissolving 1 g of the fluorinated polymer Q1 in 6 g of monoglyme, 0.25 g of a solution having a 50% hydroxylamine aqueous solution (manufactured by Wako Pure Chemical Industries, Ltd.) diluted 5 times by methanol, was added and stirred vigorously. After stirring at room temperature for 1 hour, 2 g of methanol was added, and heating was further conducted at 40° C. for 2 hours. A part of the reaction solution was cast on a glass plate and heated at 60° C. to evaporate the solvent, to produce a film having a thickness of 10 μm. IR measurements were conducted in the same manner as in Ex. 1, whereby the absorption at 1,794 cm$^{-1}$ based the —COOCH$_3$ group in the units (a1) was almost disappeared, and changed to broad absorptions in the vicinity of 1,740 cm$^{-1}$ and in the vicinity of 1,650 cm$^{-1}$ based the —CONHOH group, and thus, it was confirmed that a fluorinated polymer Q3 having a structure wherein units (a1) were all replaced by units (a3), was formed. The polymer precipitated by adding hexane to the reaction solution, was vacuum dried at 60° C., to obtain 0.81 g of fluorinated polymer Q3.

The obtained film was subjected to UV irradiation for 2 hours at a light intensity of 8 mW/cm$^2$ by using the above-mentioned low-pressure mercury lamp, and then, peeled from the glass plate and immersed again in methanol or monoglyme, whereby it was insoluble while swelled. The modulus of elasticity was measured, whereby a decrease corresponding to Tg was observed in the vicinity of 5° C., and a rubber-like plateau region was observed at a temperature of at least Tg, and thus, it was confirmed that a crosslinking reaction took place by UV irradiation.

Ex. 5: Production of Fluorinated Polymer R3

After dissolving 1 g of the fluorinated polymer R1 in 6 g of monoglyme, 0.25 g of a solution having a 50% hydroxylamine aqueous solution (manufactured by Wako Pure Chemical Industries, Ltd.) diluted 5 times by methanol, was added and stirred vigorously. After stirring at room temperature for 1 hour, 2 g of methanol was added, and heating was further conducted at 40° C. for 2 hours. A part of the reaction solution was cast on a glass plate and heated at 60° C. to evaporate the solvent, to produce a film having a thickness of 10 μm. IR measurements were conducted in the same manner as in Ex. 1, whereby the absorption at 1,794 $cm^{-1}$ based the —$COOCH_3$ group in units (a1) was almost disappeared, and changed to broad absorptions in the vicinity of 1,740 $cm^{-1}$ and in the vicinity of 1,650 $cm^{-1}$ based the —CONHOH group, and thus, it was confirmed that a fluorinated polymer R3 having a structure wherein units (a1) are all replaced by units (a3) was formed. The polymer precipitated by adding hexane to the reaction solution, was vacuum dried at 60° C. to obtain 0.87 g of fluorinated polymer R3.

The obtained film was subjected to UV irradiation for 2 hours with a light intensity of 8 mW/$cm^2$ by using the above-mentioned low-pressure mercury lamp, and then, peeled from the glass plate and immersed again in methanol or monoglyme, whereby it was insoluble while swelled. The modulus of elasticity was measured, whereby a decrease corresponding to Tg was observed in the vicinity of 15° C., and a rubber-like plateau region was observed at temperatures above Tg, and thus, it was confirmed that a crosslinking reaction took place by UV irradiation.

After dissolving 1 g of the fluorinated polymer R3 in 3 g of monoglyme, 0.7 g of surface treated type zirconia nanoparticles (manufactured by Nippon Shokubai Co., Ltd., trade name: Zircostar, average particle size: 11 nm, 23% methyl ethyl ketone solution) were mixed thereto. The mixed solution was cast on a glass plate, and the solvent was removed to obtain a visually colorless transparent nanocomposite film having a thickness of 43 μm. The refractive index of this film was measured by an Abbe refractometer and found to be 1.42 which was higher than 1.36 of the original fluorinated polymer R3. The UV transmittance of this nanocomposite film (thickness: 43 μm) was high at a level of 70% at 260 nm and 85% at 365 nm.

With respect to the fluorinated polymers in Production Examples 1 to 3 and the fluorinated polymers in Ex. 1 to 5, the contents of —$COOCH_3$ groups, —$CONHNH_2$ groups, and —CONHOH groups, the peel strength, the solubility in methanol, the adhesion and chemical resistance were measured and the results are shown in Tables 1 and 2.

TABLE 1

|  | Type of fluorinated polymer | | |
| --- | --- | --- | --- |
|  | P1 | Q1 | R1 |
| Content of —$COOCH_3$ groups in fluorinated polymer (mmol/g) | 0.56 | 0.32 | 0.22 |
| Peel strength (N/cm) | 0.85 | 0.98 | Not measured |
| Solubility in methanol | Not dissolved | Not dissolved | Not dissolved |
| Adhesion and chemical resistance | Not measured | Not measured | Not measured |

TABLE 2

|  | Ex. | | | | |
| --- | --- | --- | --- | --- | --- |
|  | 1 | 2 | 3 | 4 | 5 |
| Type of fluorinated polymer | P2 | Q2 | P3 | Q3 | R3 |
| Content of —$COOCH_3$ groups in fluorinated polymer (mmol/g) | 0.34 | 0.11 | 0 | 0 | 0 |
| Content of —$CONHNH_2$ groups in fluorinated polymer (mmol/g) | 0.22 | 0.21 | 0 | 0 | 0 |
| Content of —CONHOH groups in fluorinated polymer (mmol/g) | 0 | 0 | 0.56 | 0.32 | 0.22 |
| Peel strength (N/cm) | 1.49 | Not measured | 1.12 | 1.23 | Not measured |
| Solubility in methanol | Dissolved | Dissolved | Dissolved | Dissolved | Dissolved |
| Adhesion and chemical resistance | Present | Not measured | Not measured | Not measured | Not measured |

In each of Ex. 1 to 5, the fluorinated polymer was soluble in methanol. In each of Ex. 1 and 3, the peel strength of the film was improved over the fluorinated polymer P1, and in Ex. 4, the peel strength of the film was improved over the fluorinated polymer Q1. In each of Ex. 1 and 3, the fluorinated polymer comprised units derived from TFE, whereby side chains having high polarity groups such as —CONHOH groups and —$CONHNH_2$ groups were hardly compatible with the nonpolar matrix phase made of the main chain of the polymer and tended to be present at the interface, and thus it is considered that the peel strength was improved. Further, in Ex. 4, the polymer comprised units derived from TrFE, whereby —CONHOH groups were likely to be compatible with the nonpolar matrix phase made of the main chain of the polymer, but —CONHOH groups tended to interact with OH groups present on the glass plate as the substrate, and thus, it is considered that the peel strength was improved.

In Ex. 1, in the evaluation of adhesion and chemical resistance, there was no peeling between the stainless steel plate and the quartz plate, and thus, the composite plate had adhesion and chemical resistance.

INDUSTRIAL APPLICABILITY

According to the present invention, it is possible to provide a fluorinated polymer which is excellent in solubility in an alcohol and capable of being cured.

The fluorinated polymer of the present invention is useful as e.g. an optical material, a sealing material for elements, an inorganic EL phosphor dispersing material, an optical waveguide material, a heat and chemical resistant sealing material, an adhesive, or a coating material. The coating composition of the present invention is useful as a release agent, an antifouling coating material, a chemically resistant protective coating material, etc.

The cured product formed from the fluorinated polymer of the present invention is useful as a transparent sealant for UV-LED.

The molded product made of a cured product formed from the fluorinated polymer of the present invention is useful as a core material or cladding material of optical fibers, as a core material or cladding material of optical waveguides, or as a lens material.

A substrate provided with a cured product formed from the fluorinated polymer of the present invention is useful for a light-emitting element, a semiconductor element, a solar cell element, a short-wavelength light emitting element, etc. and particularly useful for a light-emitting device comprising a light emitting element and a cured product of the fluorinated polymer.

This application is a continuation of PCT Application No. PCT/JP2016/075078, filed on Aug. 26, 2016, which is based upon and claims the benefit of priority from Japanese Patent Application No. 2015-171756 filed on Sep. 1, 2015. The contents of those applications are incorporated herein by reference in their entireties.

What is claimed is:

1. A fluorinated polymer comprising units represented by the following formula (1), wherein in at least some of the units represented by the formula (1), $Z^1$ is $NR^1NR^2H$ or $NR^3OR^4$:

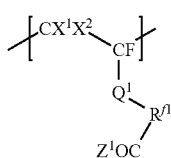

(1)

in the formula (1), $X^1$ and $X^2$ are each independently a hydrogen atom or a fluorine atom, $Q^1$ is a single bond or an etheric oxygen atom, $R^{f1}$ is a fluoroalkylene group, or a fluoroalkylene group with at least 2 carbon atoms, having an etheric oxygen atom between carbon-carbon atoms, $Z^1$ is $NR^1NR^2H$, $NR^3OR^4$ or $OR^5$, $R^1$, $R^2$, $R^3$ and $R^4$ are each independently a hydrogen atom or an alkyl group, and $R^5$ is an alkyl group.

2. The fluorinated polymer according to claim 1, wherein at least some of the units represented by the formula (1) are —[CF$_2$—CF(O(CF$_2$)$_3$CONHNH$_2$)]— or —[CF$_2$—CF(O(CF$_2$)$_3$CONHOH)]—.

3. The fluorinated polymer according to claim 1, which comprises units wherein $Z^1$ is $NR^1NR^2H$ and units wherein $Z^1$ is $OR^5$.

4. The fluorinated polymer according to claim 1, which comprises units wherein $Z^1$ is $NR^3OR^4$.

5. The fluorinated polymer according to claim 1, which further contains units derived from fluoroethylene.

6. The fluorinated polymer according to claim 1, which further contains units represented by the following formula (3) (but excluding units derived from fluoroethylene):

—[CX$^3$X$^4$—CY$^1$Y$^2$]—   (3)

in the formula (3), $X^3$ and $X^4$ are each independently a hydrogen atom, a fluorine atom or a chlorine atom, $Y^1$ is a hydrogen atom, a fluorine atom or a chlorine atom, and $Y^2$ is a hydrogen atom, a fluoroalkyl group, a fluoroalkyl group with at least 2 carbon atoms, having an etheric oxygen atom between carbon-carbon atoms, a fluoroalkoxy group, a fluoroalkoxy group with at least 2 carbon atoms, having an etheric oxygen atom between carbon-carbon atoms, a fluoroalkenyl group, or a fluoroalkenyl group with at least 2 carbon atoms, having an etheric oxygen atom between carbon-carbon atoms.

7. The fluorinated polymer according to claim 1, wherein the proportion of the group represented by —COZ$^1$ is from 0.1 to 4 mmol/g.

8. A method for producing the fluorinated polymer as defined in claim 1, characterized by reacting a fluorinated polymer comprising units represented by the following formula (1a), with at least one compound selected from the group consisting of a hydrazine compound of the following formula (5) and a hydroxylamine compound represented by the following formula (6):

(1a)

HR$^1$N—NR$^2$H   (5)

NHR$^3$OR$^4$   (6)

in formula (1a), $X^1$, $X^2$, $Q^1$, $R^{f1}$ and $R^5$ are as defined in claim 1, in the formula (5), $R^1$ and $R^2$ are as defined in claim 1, and in the formula (6), $R^3$ and $R^4$ are as defined in claim 1.

9. A method for producing a cured product of a fluorinated polymer, characterized by subjecting the fluorinated polymer as defined in claim 1 to at least one of heating and active energy ray irradiation.

10. A light emitting device characterized by comprising a light emitting element and a cured product of the fluorinated polymer as defined in claim 1.

* * * * *